United States Patent
Ueki et al.

(10) Patent No.: US 6,330,728 B2
(45) Date of Patent: Dec. 18, 2001

(54) BRUSH SCRUBBING APPARATUS

(75) Inventors: Koji Ueki; Takashi Osako, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/758,214

(22) Filed: Jan. 12, 2001

Related U.S. Application Data (62) Division of application No. 09/263,687, filed on Mar. 5, 1999, now Pat. No. 6,219,872.

(30) Foreign Application Priority Data

Mar. 9, 1998 (JP) .................................................. 10-057166

(51) Int. Cl.[7] ................................ B08B 1/04; A46B 13/02
(52) U.S. Cl. .................................................. 15/77; 15/88.2
(58) Field of Search ............................. 15/21.1, 77, 88.1, 15/88.4, 97.1, 102

(56) References Cited

U.S. PATENT DOCUMENTS

| | | | |
|---|---|---|---|
| 4,382,308 | * | 5/1983 | Curcio ........................................ 15/77 |
| 4,993,096 | * | 2/1991 | D'Amato .................................... 15/77 |
| 5,012,526 | * | 5/1991 | Romans et al. ..................... 15/21.1 X |
| 5,475,889 | * | 12/1995 | Thrasher et al. ......................... 15/88.3 |
| 5,829,087 | * | 11/1998 | Nishimura et al. ..................... 15/88.2 |
| 5,943,726 | * | 8/1999 | Eitoku et al. ............................... 15/77 |

FOREIGN PATENT DOCUMENTS

| | | | |
|---|---|---|---|
| 5-301082 | * | 11/1993 | (JP) ........................................ 15/77 |
| 6-464 | * | 1/1994 | (JP) ........................................ 15/77 |
| 08-206617 | | 8/1996 | (JP) . |

OTHER PUBLICATIONS

Kenjui Sugimoto et al., Silicon Wafer Hyomen No Kurinka-Gijyutu, pp. 293–295, Realize Inc.

* cited by examiner

Primary Examiner—Mark Spisich
(74) Attorney, Agent, or Firm—Rabin & Berdo (57) ABSTRACT

A brush scrubbing apparatus is made up of a wafer holder which retains a wafer, a brush which removes a particle on the wafer, a driver which rotates at least one of the wafer holder and the wafer, an alignment mechanism which defines a relative position between the brush and the wafer holder, and controller which controls the alignment mechanism responding to a driving power supply voltage in the driver. The brush scrubbing apparatus can precisely get the reference position for deciding the pushing distance without using the eye measurement.

4 Claims, 7 Drawing Sheets

BRUSH SCRUBBING APPARATUS

This is a Divisional of application Ser. No. 09/263,687, filed Mar. 5, 1999, now U.S. Pat. No. 6,218,872.

BACKGROUND OF THE INVENTION

1. Field of the Invention

The present invention generally relates to a brush scrubbing apparatus, and more particularly, the present invention relates to the brush scrubbing apparatus for a semiconductor wafer.

This application is a counterpart of Japanese application Serial Number 57166/1998, filed Mar. 9, 1998, the subject matter of which is incorporated herein by reference.

2. Description of the Related Art

In general, a conventional brush scrubbing apparatus has been used for scrubbing a semiconductor wafer. The conventional brush scrubbing apparatus has been disclosed in "SILICON WAFER HYOMEN NO KURINKA-GIJYUTU, KENJI SUGIMOTO et al, REALIZE INC, pp. 293–294", and Japanese Patent Laid Open No.8-206617.

In the conventional brush scrubbing apparatus, a rotating brush pushes to the surface of the semiconductor wafer and moves along it while a cleaning solution such as deionized water is supplied to the rotating brush. As a result, the conventional brush scrubbing apparatus removes particles hydrodynamically while the rotating brush rubs the surface of the semiconductor wafer.

More particularly, the conventional brush scrubbing apparatus retains the semiconductor wafer on a rotating turntable, the semiconductor wafer turns on a vertical axis while the deionized water is supplied to the surface of the semiconductor wafer. In this circumstances, a rotating brush mounted on a bottom portion of an arm, which moves above the semiconductor wafer, then contact to the surface of the semiconductor wafer via the dieionized water, and then thrusts the surface of the semiconductor wafer. And then the rotating brush moves along the surface of the semiconductor wafer. As a result, the conventional brush scrubbing apparatus removes particles.

In the conventional brush scrubbing apparatus, a predetermined distance to be thrust downward from a reference position of brush, which influences a cleaning effect and a damage to the semiconductor wafer. The reference position is a position that the rotating brush contacts to the surface of the semiconductor wafer. The set of the reference position decides with an eye measurement. When adjusting the predetermined distance, it is precisely important to set the reference position.

In the conventional brush scrubbing apparatus, it is desirable to precisely get the reference position for deciding the predetermined distance without using the eye measurement.

SUMMARY OF THE INVENTION

An object of the present invention is to provide a brush scrubbing apparatus that can precisely get a position as the reference position that the brush contact to the surface of the semiconductor wafer without using an eye measurement.

According to one aspect of the present invention, for achieving the above object, there is provided a brush scrubbing apparatus comprising: a rotating turntable which retains a wafer; a brush which removes a particle on the wafer; and a controller which detects a reference position responding to a change of a driving current value for driving the brush, and which stores a predetermined distance to thrust downward from the reference position; wherein the reference position is a position which the brush contacts to the wafer.

According to another aspect of the present invention, for achieving the above object, there is provided a brush scrubbing apparatus comprising: a rotating turntable which retains a wafer; a brush which removes a particle on the wafer; and a controller which detects a reference position responding to a change of a first current value for driving the brush, which stores a predetermined distance to thrust downward from the reference position, and , and which stores a second current value for driving the brush when making go down the brush until the predetermined distance to thrust downward from the reference position, and which finds a differential value between the first and second current values and compares between the differential value and a predetermined threshold value; wherein the reference position is a position which the brush contacts to the wafer.

According to another aspect of the present invention, for achieving the above object, there is provided a brush scrubbing apparatus comprising: a rotating turntable which retains a wafer; a brush which removes a particle on the wafer; a controller which detects a reference position responding to a change of a driving current value for driving the wafer, and which stores a predetermined distance to thrust downward from the reference position; wherein the reference position is a position which the brush contacts to the wafer.

According to another aspect of the present invention, for achieving the above object, there is provided a brush scrubbing apparatus comprising: a brush holder; a brush; and a controller which detects a reference position responding to a change of a driving current value for driving the brush; wherein the reference position is a position which the brush contacts to the brush holder.

According to another aspect of the present invention, for achieving the above object, there is provided a brush scrubbing apparatus comprising: a rotation holder; a brush; a tachometer which detects a rotation speed of the brush via the rotation holder; and a controller which detects a reference position responding to a signal when the brush contacts to the rotation holder.

BRIEF DESCRIPTION OF THE DRAWINGS

While the specification concludes claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A brush scrubbing apparatus according to a first preferred embodiment of a present invention will hereinafter be described in detail with reference to FIG. 1.

Figure 1:
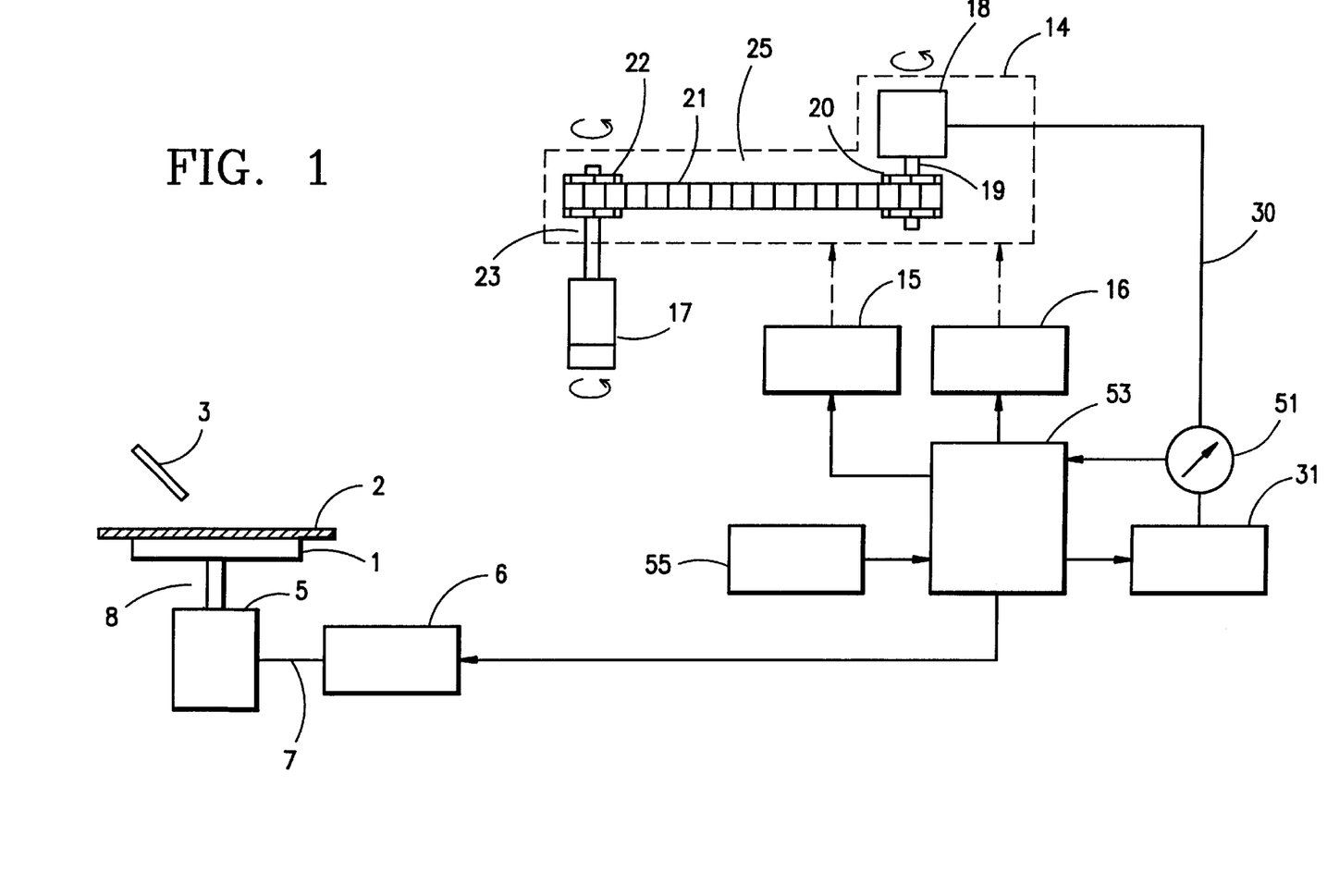
FIG. 1 is a diagram showing a brush scrubbing apparatus according to a first preferred embodiment of a present invention.

FIG. 1 is a diagram showing a brush scrubbing apparatus according to a first preferred embodiment of a present invention.

As shown in FIG. 1, a brush scrubbing apparatus is preferably made up of a wafer rotating apparatus 8, a first voltage supply circuit 6, a nozzle 3, a brush 17, a brush spin mechanism 25, an arm mechanism 14, an arm swing mechanism 15, an arm up and down mechanism 16, a second voltage supply circuit 31, and a controller 53. The wafer rotating apparatus 8 is preferably made up of a rotating turntable 1 which horizontally retain a semiconductor wafer 2 and which turns on a vertical axis, and a wafer spin motor 5. The first voltage supply circuit 6 supplies a power to the wafer spin motor 5. The nozzle 3 supplies a cleaning solution to a surface of the semiconductor wafer 2. The brush 17 removes particles by contacting to the surface of the semiconductor wafer 2 while rotating. The brush spin mechanism 25 rotates the brush 17, which is preferably made up of a brush spin motor 18, a driving shaft 19 as a driving axis of the brush spin motor 18, a driving gear 20 which mounted to the driving shaft 19, a shaft 23 to be operated the brush 17, a gear 22 to be operated the shaft 23, and a transmission belt 21 which connect between the driving gear 20 and the gear 22. The arm,mechanism 14 retains the brush 17. The arm swing mechanism 15 and the arm up and down mechanism 16 swing an arm (not shown) and go up and down the arm. The second voltage supply circuit 31 supplies a power with a power supply voltage line 30 to the brush spin mechanism 25.

Further, the brush scrubbing apparatus preferably includes a current detector 51 which detects a driving current value of the brush spin motor 18 between the brush spin motor 18 and the second voltage supply circuit 31, the controller 53 which controls, responding to a signal from the current detector 51, the arm swing mechanism 15, an arm up and down mechanism 16, the first voltage supply circuit 6, and the second voltage supply circuit 31, and a keyboard 55 for inputting a data to the controller 53. In this apparatus, the controller 53 is preferably a microprocessor which comprises CPU, ROM, and RAM, for example.

Figure 2:
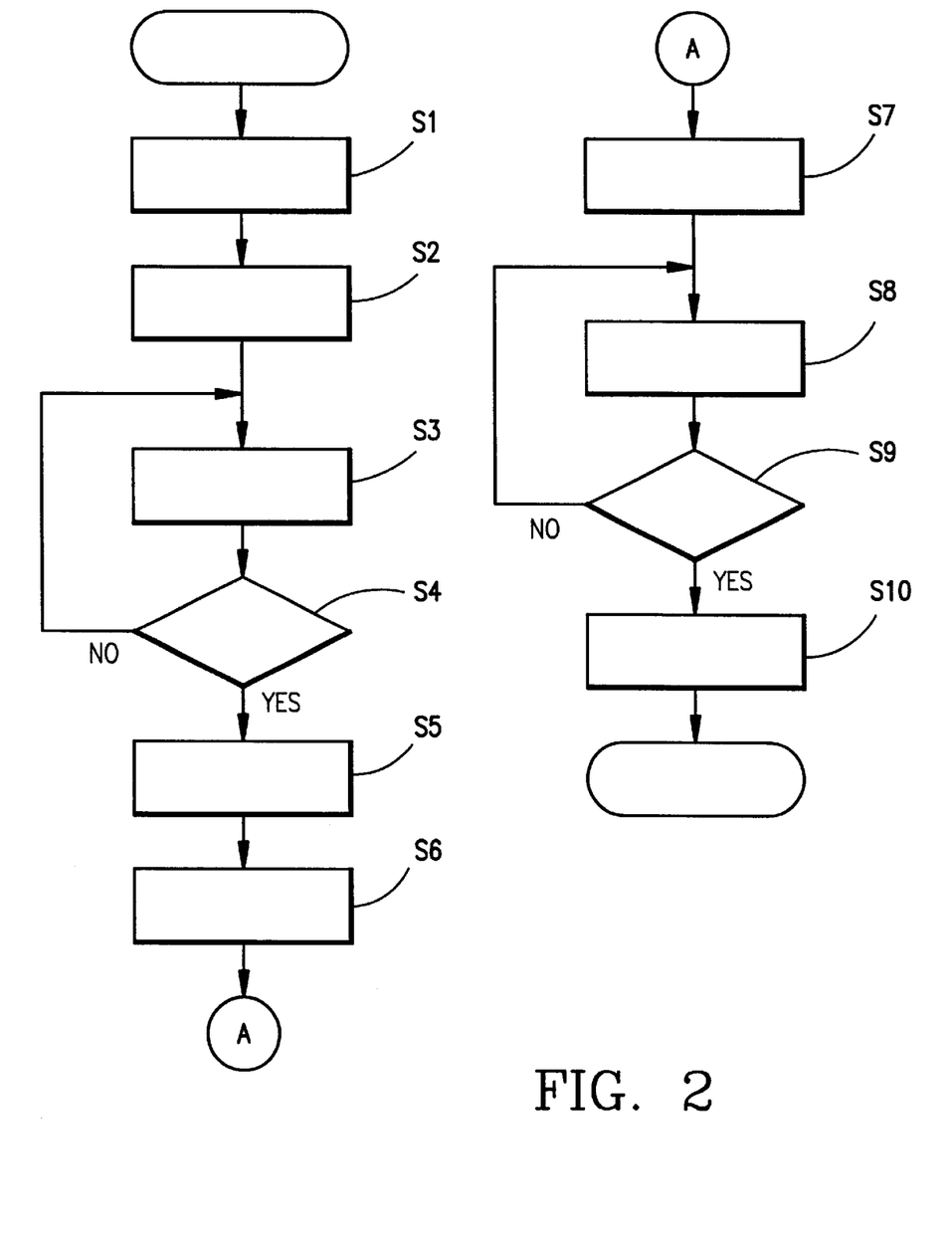
FIG. 2 is a flow chart showing an operation of a brush scrubbing apparatus according to a first preferred embodiment of a present invention.

FIG. 2 is a flow chart showing an operation of a brush scrubbing apparatus according to a first preferred embodiment of a present invention.

As shown in FIG. 2, the controller 53 inputs, in advance, a predetermined distance to thrust downward from a reference position that the brush contacts to the semiconductor wafer and a cleaning time, inputted by an operator via the keyboard (see S1). Here, the reference position is a position that the rotating brush 17 contacts to the semiconductor wafer 17 surface.

Next, the rotating turntable 1 horizontally retains the semiconductor wafer 2 thereon. The semiconductor wafer 2 turns on a vertical axis at a predetermined rotation speed. While supplying a deionized water to the semiconductor wafer 2 surface from the nozzle 3, the brush 17 moves above the semiconductor wafer 2 edge using the arm swing mechanism 15. At the same time, the controller 53 is applied a power from the second voltage supply circuit 31 to the brush spin motor 18. As a result, the controller 53 rotates the brush 17 at a predetermined rotation speed (see S2).

Next, the brush 17 slowly goes down to the semiconductor wafer 2 surface by operating the arm up and down mechanism 16 (see S3). After operated above, the current detector 51 detects a driving current value of the brush spin motor 18 and outputs the driving current value to the controller 53. The brush 17 tip contacts to the semiconductor wafer 2 surface, as a result the driving current value of the brush spin motor 18 changes. The controller 53 detects the reference position that the semiconductor wafer 2 surface contacts to the brush 17 tip responding to the change of the driving current value (see S4) and stops going down to the semiconductor wafer 2 (see S5). The reference position stores in the controller 53 (see S6).

Next, the controller 53 goes down the brush 17 until a predetermined distance to thrust downward from the reference point using the arm up and down mechanism 16, and then the brush 17 is fixed (see S7).

Next, a scrubbing treatment carries out by swinging an arm body 14 using the arm swing mechanism 15 (see S8).

When the controller 53 detects a progress of the predetermined cleaning time (see S9), the swing operation stops and then the arm body 14 goes up (see S10)

Finally, the semiconductor wafer 2 is dried.

As mentioned above, the brush scrubbing apparatus according to the first preferred embodiment of the invention electrically detects the reference position that the brush contact to the semiconductor wafer 2 surface. Accordingly, it can precisely get the reference position without using an eye measurement.

In the first preferred embodiment of the invention, the brush 17 goes up and down, but the semiconductor wafer 2 may be went up and down. The scrubbing step is carried out while rotating the semiconductor wafer 2, but it may be carried out without rotating.

A brush scrubbing apparatus according to a second preferred embodiment of a present invention will hereinafter be described in detail with reference to FIGS. 1 and 3.

Figure 3:
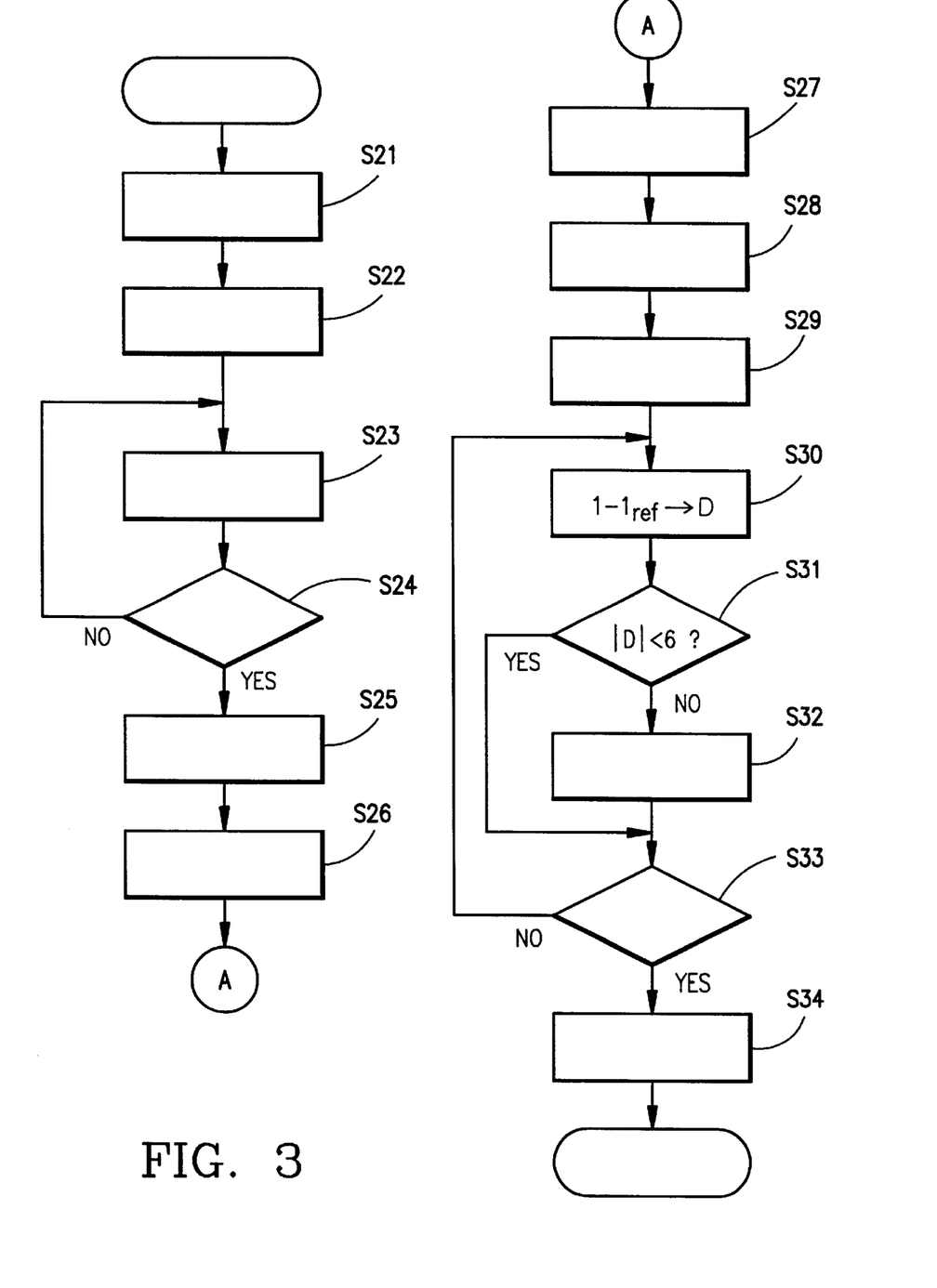
FIG. 3 is a flow chart showing an operation of a brush scrubbing apparatus according to a second preferred embodiment of a present invention.

FIG. 3 is a flow chart showing an operation of a brush scrubbing apparatus according to a second preferred embodiment of a present invention.

As shown in FIG. 3, the controller 53 inputs, in advance, a predetermined distance to thrust downward from a reference position that the brush contacts to the semiconductor wafer and a cleaning time, inputted by an operator via the keyboard (see S21). Here, the reference position is a position that the rotating brush 17 contacts to the semiconductor wafer 17 surface.

Next, the rotating turntable 1 horizontally retains the semiconductor wafer 2 thereon. The semiconductor wafer 2 turns on a vertical axis at a predetermined rotation speed. While supplying a deionized water to the semiconductor wafer 2 surface from the nozzle 3, the brush 17 moves above the semiconductor wafer 2 edge using the arm swing mechanism 15. At the same time, the controller 53 is applied a power from the second voltage supply circuit 31 to the brush spin motor 18. As a result, the controller 53 rotates the brush 17 at a predetermined rotation speed (see S22).

Next, the brush 17 slowly goes down to the semiconductor wafer 2 surface by operating the arm up and down mechanism 16 (see S23).

After that, the current detector 51 detects a driving current value of the brush spin motor 18 and outputs the driving current value to the controller 53. The brush 17 tip contacts to the semiconductor wafer 2 surface, as a result the driving current value of the brush spin motor 18 changes. The controller 53 detects the reference position that the semiconductor wafer 2 surface contacts to the brush 17 tip responding to the change of the driving current value (see S24) and stops going down to the semiconductor wafer (see S25).

The reference position stores in the controller 53 (see S26).

Next, the controller 53 goes down the brush 17 until a predetermined distance to thrust downward from the reference point using the arm up and down mechanism 16, and then the brush 17 is fixed (see S27).

Further, in this time, the controller 53 stores a current value as a reference current value $I_{ref}$ of a brush spin motor 18(see S28). The reference current value $I_{ref}$ is used to constantly control the reference position responding to patterns formed on the semiconductor wafer surface.

Next, a scrubbing treatment carries out by swinging an arm body 14 using the arm swing mechanism 15 (see S29).

In this time, the controller 53 stores a current value of a brush spin motor 18. Then, it compares between the current value and the reference current $I_{ref}$. As a result, it finds a differential value $D(=I-I_{ref})$ between a driving current value (I) and the reference current $I_{ref}$ (see S30).

The controller 53 compares between the differential value D and a predetermined threshold value $\epsilon$. The predetermined threshold value $\epsilon$ is a permissible rage for a change from the reference current $I_{ref}$ (see S31).

When the differential value D is more than the threshold value $\epsilon$, the arm mechanism 16 controls responding to the differential value D so that the driving current value during the scrubbing step makes equal the reference current $I_{ref}$ (see S32).

The S30–S32 steps during a scrubbing step is continuously carried out.

When the controller 53 detects to terminate the predetermined cleaning time (see S33), the swing operation stops and then the arm body 14 goes up (see S34).

Finally, the semiconductor wafer 2 is dried.

As mentioned above, the second preferred embodiment of a present invention controls the reference position responding to the patterns formed on the semiconductor wafer, at real-time processing. Accordingly, the second preferred embodiment of a present invention can constantly maintain the reference position corresponding to the patterns formed on the semiconductor wafer 2 surface during scrubbing.

A brush scrubbing apparatus according to a third preferred embodiment of a present invention will hereinafter be described in detail with reference to FIG. 4.

Figure 4:
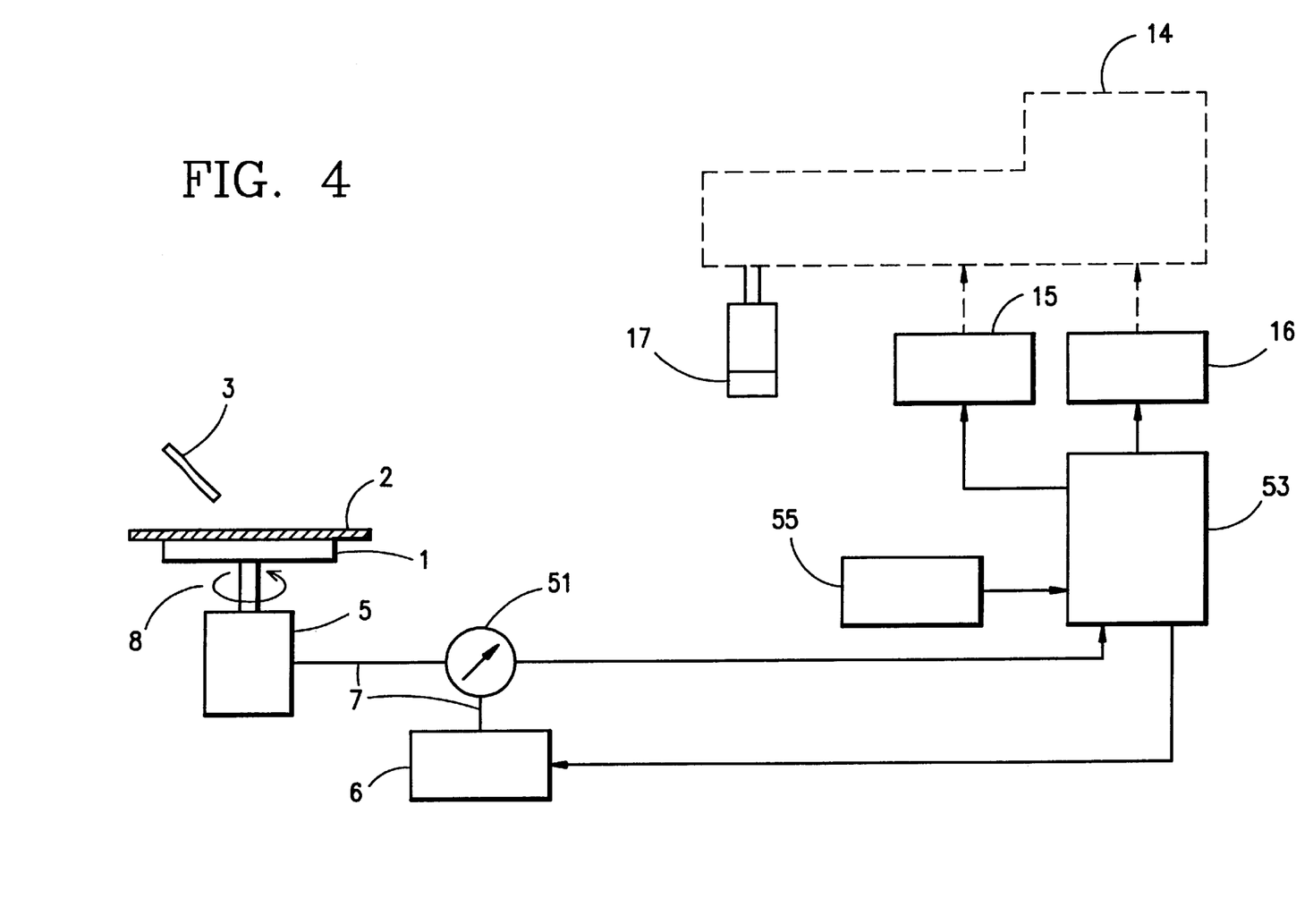
FIG. 4 is a diagram showing a brush scrubbing apparatus according to a third preferred embodiment of a present invention.

FIG. 4 is a diagram showing a brush scrubbing apparatus according to a third preferred embodiment of a present invention.

The third preferred embodiment of a present invention finds a reference position using a driving current value of the wafer spin motor 5 when a brush 17 tip contacts to a semiconductor wafer 2 surface. Accordingly, the third preferred embodiment can adopt the brush scrubbing apparatus having a structure so that a brush 17 does not have a rotating function, or the brush 17 fixes to an arm body 14. The third preferred embodiment includes a current detector 51 to detect a driving current value of the wafer spin motor 5, which forms between the wafer spin motor 5 and a voltage supply circuit 6. A controller 53 receives a signal from the current detector 51. As a result, it controls an arm swing mechanism 15, and the arm up and down mechanism 16. The third preferred embodiment can control in a similar manner as the first and second preferred embodiments using the driving current value of the wafer spin motor 5 instead of the driving current value of the brush spin motor 18 in accordance with the flow charts showing the operation of the brush scrubbing apparatus according to the first and second preferred embodiments.

As mentioned above, the third preferred embodiment of the present invention can adopt the brush scrubbing apparatus having a structure so that a brush does not have the rotating function, or the brush 17 fixes to an arm body. Accordingly, the third preferred embodiment can decrease a size of the brush scrubbing apparatus.

A brush scrubbing apparatus according to a fourth preferred embodiment of a present invention will hereinafter be described in detail with reference to FIG. 5.

Figure 5:
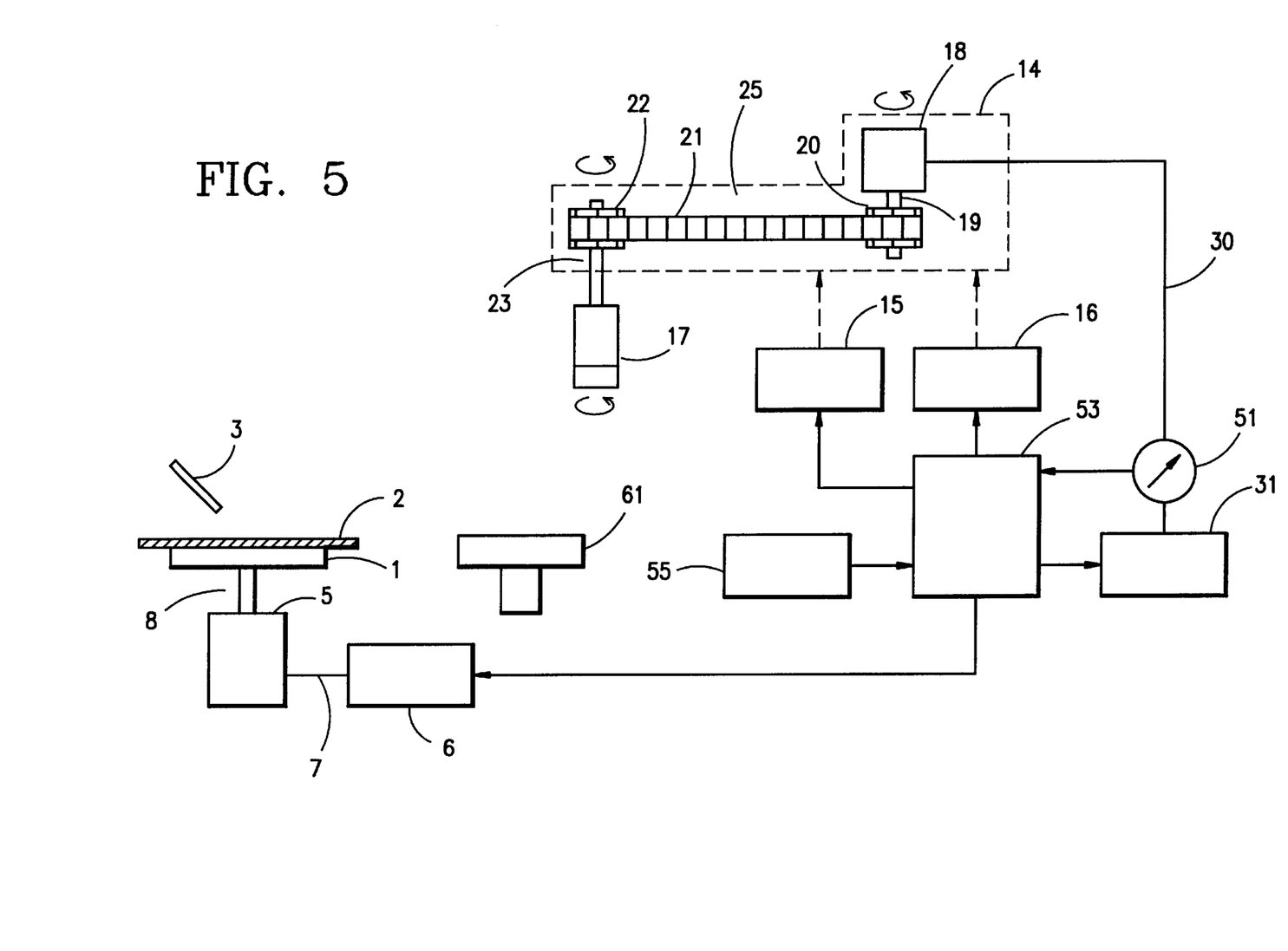
FIG. 5 is a diagram showing a brush scrubbing apparatus according to a fourth preferred embodiment of a present invention.

FIG. 5 is a diagram showing a brush scrubbing apparatus according to a fourth preferred embodiment of a present invention.

The fourth preferred embodiment of a present invention can electrically detect an abrasion and a fatigue of the brush. The fourth preferred embodiment of a present invention adds a brush holder 61 to the first preferred embodiment. The brush holder 61 forms so as to make possible to revolve near the wafer rotating apparatus 8.

The brush 17 is moved above the brush holder 61 surface using the arm swing mechanism 15. Next, the brush 17 slowly goes down to the brush holder 61 by the arm up and down mechanism 16 while rotating the brush 17 at a predetermined spin speed. Then, the brush 17 tip contacts to the brush holder 61 and then if a driving current value oh the brush spin motor 18 changes, the controller 53 detects a position that the brush 17 tip contacts to the brush holder 61 responding to the change of the driving current value, the arm stops going down, and the position is stored. After that, the arm goes up. The arm is returned to the beginning stage.

The steps as mentioned above is carried out at a predetermined frequency. As a result, the fourth preferred embodiment of a present invention can appropriately adjust a distance to thrust downward from a reference position that the brush contacts to the semiconductor wafer on the basis of a degree of the abrasion and the fatigue of the brush.

A brush scrubbing apparatus according to a fifth preferred embodiment of a present invention will hereinafter be described in detail with reference to FIG. 6 and FIG. 7.

Figure 6:
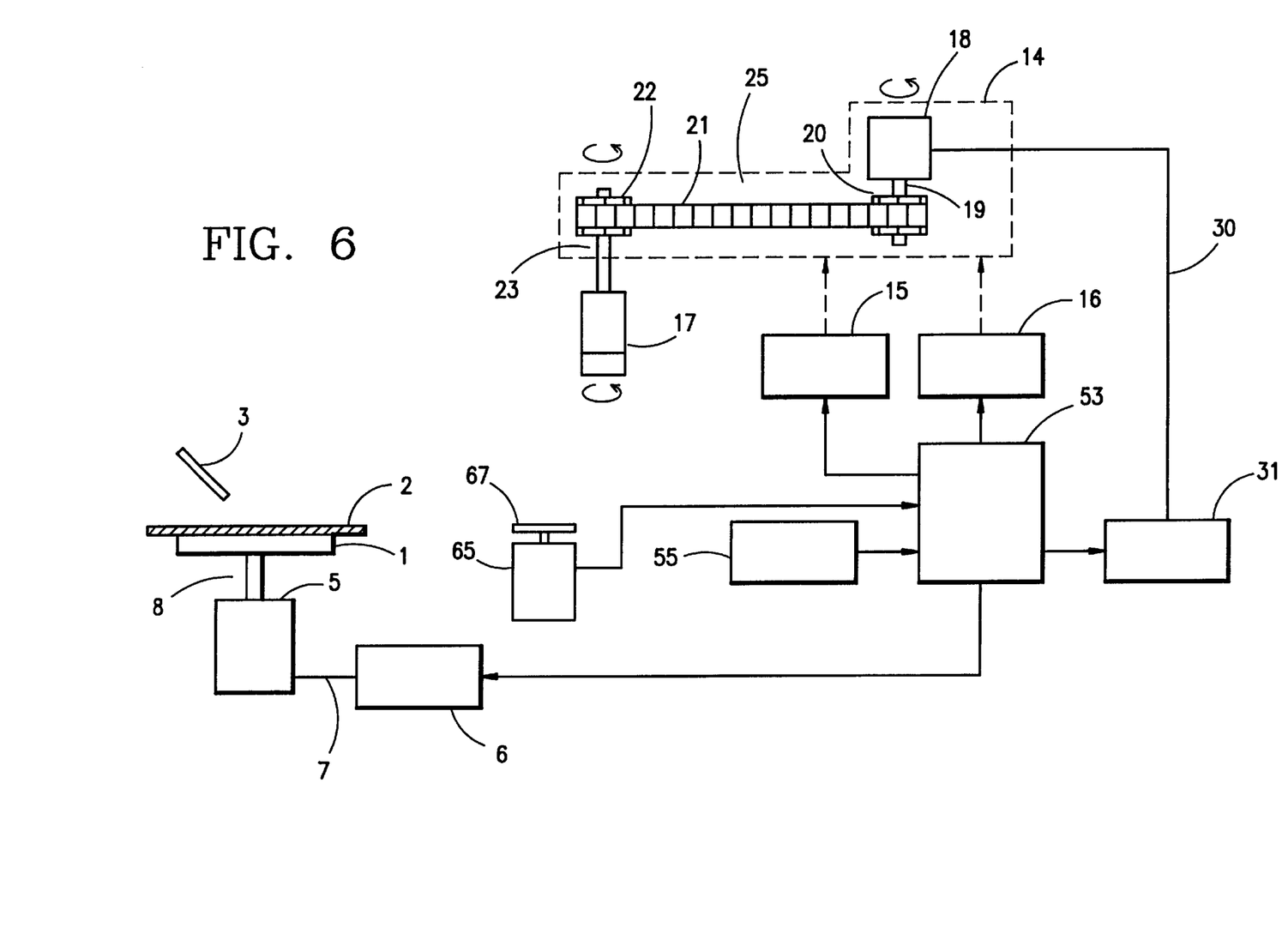
FIG. 6 is a diagram showing a brush scrubbing apparatus according to a fifth preferred embodiment of a present invention.
Figure 7:
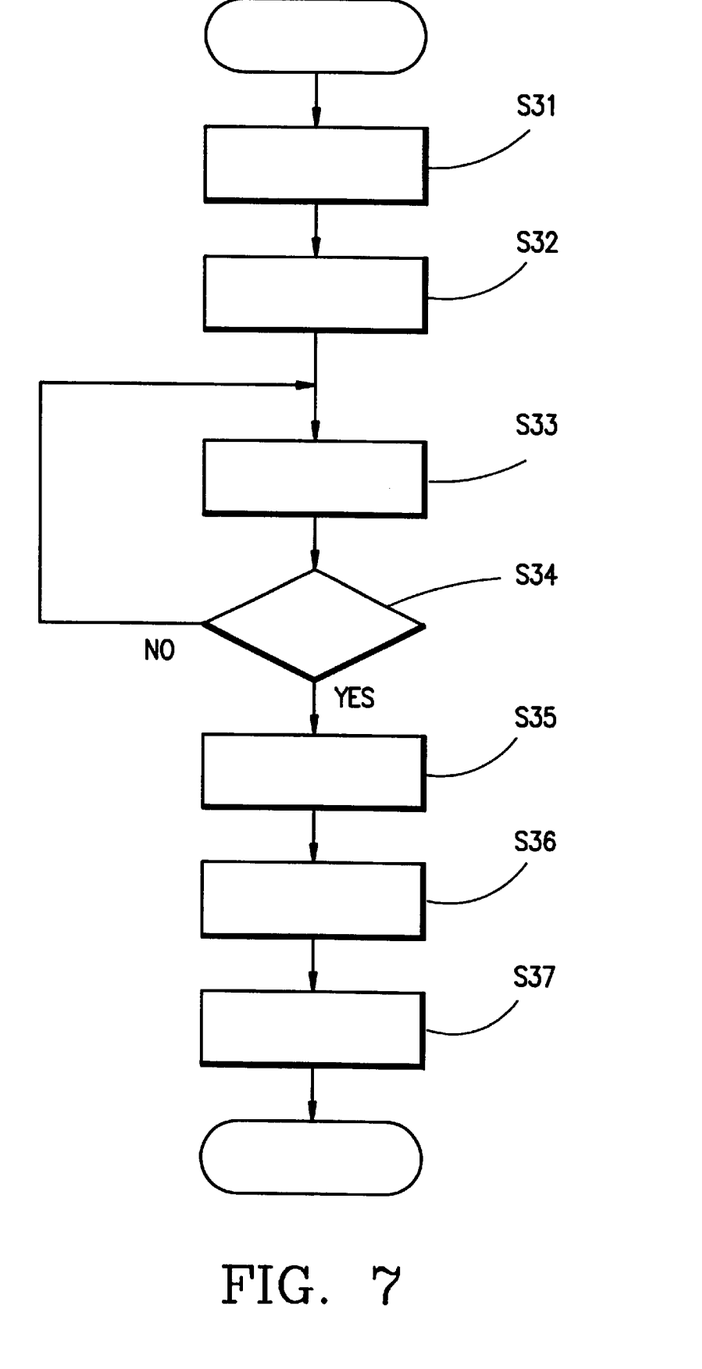
FIG. 7 is a flow chart showing an operation of a brush scrubbing apparatus according to a fifth preferred embodiment of a present invention.

FIG. 6 is a diagram showing a brush scrubbing apparatus according to a fifth preferred embodiment of a present invention. FIG. 7 is a flow chart showing an operation of a brush scrubbing apparatus according to a fifth preferred embodiment of a present invention.

The fifth preferred embodiment of a present invention is characterized to have a tachometer 65 for detecting a rotation speed of the brush.

The brush 17 is moved above the rotation holder 67 of the tachometer 65 using the arm swing mechanism 15 (see S31). Next, while rotating the brush 17 at a predetermined spin speed (see S32), the brush 17 slowly goes down to the rotation holder 67 using the arm up and down mechanism 16 (see S33). Then, the brush 17 tip contacts to the rotation holder 67. As a result, the rotation holder 67 starts to rotate. The controller 53 finds a first position that the brush 17 contacts to the semiconductor wafer 2 by receiving a signal of the tachometer 65 for detecting a rotation (see S34). The arm stops going down (see S35), and the first position is stored (see S36).

The controller 53 finds, in advance, a second position that the brush 17 contacts to the semiconductor wafer 2, in a beginning stage for brush scrubbing steps. The controller 53 compares between the first and second positions. As a result, it can find the abrasion volume from a difference between the first and second positions. A predetermined reference abrasion volume compares with the found abrasion volume (see S37). After that, the arm goes up. The arm is returned to the beginning stage.

The fifth preferred embodiment of a present invention carries out the steps as mentioned above at a predetermined frequency. As a result, it can precisely find the abrasion volume of the brush 17.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A brush scrubbing apparatus, comprising:

a rotating turntable which retains a wafer;

a brush which removes a particle on the wafer;

driving means for driving the brush through the use of a driving current; and a controller which detects a reference position of said brush responding to a change of a first current value for driving the brush, the change being caused by the brush contacting the wafer, said controller further storing a predetermined distance to thrust said brush downward from the reference position, said controller also storing a second current value for driving the brush when the brush is moved downward toward the wafer until the predetermined distance to thrust said brush downward from the reference position is reached, said controller finding a differential value between the first and second current values and comparing the differential value and a predetermined threshold value;

wherein the reference position is a position in which the brush contacts the wafer.

2. A brush scrubbing apparatus as claimed in claim 1, further comprising:

a wafer rotating apparatus which includes the rotating turntable which horizontally retains the wafer and which turns on a vertical axis, and a wafer spin motor;

a first voltage supply circuit which supplies power to the wafer spin motor;

a nozzle which supplies a cleaning solution to a surface of the wafer;

a brush spin mechanism which rotates the brush, and which includes a brush spin motor, a driving shaft as a driving axis of the brush spin motor, a driving gear which is mounted to the driving shaft, a brush shaft to operate the brush, a gear to operate the brush shaft, and a transmission belt which connects between the driving gear and the gear;

an arm;

an arm mechanism which retains the brush;

an arm swing mechanism which swings the arm;

an arm up and down mechanism which moves the arm up and down; and a second voltage supply circuit which supplies power with a power supply voltage line to the brush spin mechanism.

3. A brush scrubbing apparatus as claimed in claim 2, wherein the cleaning solution is a deionized water.

4. A brush scrubbing apparatus as claimed in claim 2, wherein the predetermined threshold value is a permissible range for a change from the current value at the reference position, and when the differential value is more than the threshold value, the arm mechanism controls responding to the differential value so that the driving current value during the scrubbing step is made equal to the reference current.

* * * * *